(12) United States Patent
Ward

(10) Patent No.: US 8,976,494 B2
(45) Date of Patent: Mar. 10, 2015

(54) DEVICE FOR DETECTING A FAULT IN AN AC SUPPLY

(75) Inventor: Patrick Ward, Ballinasloe (IE)

(73) Assignee: Shakira Limited, Ballinasloe (IE)

( * ) Notice: Subject to any disclaimer, the term of this patent is extended or adjusted under 35 U.S.C. 154(b) by 267 days.

(21) Appl. No.: 13/414,187

(22) Filed: Mar. 7, 2012

(65) Prior Publication Data

US 2012/0229943 A1    Sep. 13, 2012

(30) Foreign Application Priority Data

Mar. 9, 2011    (IE) .................................. S2011/0111

(51) Int. Cl.
*H02H 3/00*    (2006.01)
*H02H 9/08*    (2006.01)
*H02H 3/33*    (2006.01)
*H02H 7/00*    (2006.01)
*G01R 31/42*    (2006.01)

(52) U.S. Cl.
CPC .................. *H02H 3/33* (2013.01); *G01R 31/42* (2013.01); *H02H 3/335* (2013.01)
USPC ................................................. 361/42; 361/2

(58) Field of Classification Search
CPC ...................................................... H02H 3/335
USPC ......................................................... 361/2, 42
See application file for complete search history.

(56) References Cited

U.S. PATENT DOCUMENTS

| | | | | |
|---|---|---|---|---|
| 3,746,964 | A * | 7/1973 | Guyton | 363/54 |
| 6,433,977 | B1 * | 8/2002 | Macbeth | 361/42 |
| 6,654,216 | B2 * | 11/2003 | Horvath et al. | 361/65 |
| 6,873,158 | B2 * | 3/2005 | Macbeth | 324/509 |
| 8,072,718 | B2 * | 12/2011 | Radosavljevic et al. | 361/42 |

* cited by examiner

*Primary Examiner* — Thienvu Tran
*Assistant Examiner* — Lucy Thomas
(74) *Attorney, Agent, or Firm* — Withrow & Terranova, P.L.L.C.

(57) ABSTRACT

A device for detecting a fault in an AC supply comprises a circuit (CT, 100) for detecting a particular type of fault in an AC supply to a load (LD) and providing a corresponding output (10). A relay (RLA) is responsive to said output (10) to open a set of load contacts (SW1) in the AC supply to disconnect the load from the supply. Test means (TS, Rt, W2) are provided for simulating a supply fault of the said type, and means (C3, R5, SCR2, SOL, SW2) are provided for causing the load contacts (SW1) to open if they do not open in response to the simulated fault within a certain period of time.

8 Claims, 7 Drawing Sheets

DEVICE FOR DETECTING A FAULT IN AN AC SUPPLY

TECHNICAL FIELD

This invention relates to devices for detecting a fault in an AC supply, for example residual current devices (RCDs) and arc fault detectors (AFDs).

BACKGROUND

Residual current devices, which are also referred to as ground fault circuit interrupters (GFCIs), have been in use worldwide for over forty years, and these devices have contributed significantly to the reduction in fatal accidents arising from electric shock. The principle of operation of RCDs will be well known to those versed in the art, but detailed information can be found in the article "Demystifying RCDs", at www.rcd.ie, which is incorporated herein by reference in its entirety.

RCDs are fitted with a test device, often a manually operable button, to enable the user to verify the correct operation of the device, but if the RCD fails to trip on operation of the test device the user may be tempted to simply disregard this warning sign of failure or may delay unduly in replacing the RCD. Once the RCD has failed for any reason it ceases to provide any protection and should be replaced immediately.

It is an object of the invention to provide an RCD, or other fault detecting device such as an AFD, which incorporates means to remove power from the load in the event of the device failing to trip when operated by the test device. This is sometimes referred to as "end of life" operation or an "end of life" condition.

SUMMARY

According to the invention there is provided a device for detecting a fault in an AC supply, comprising a circuit (CT, 100) for detecting a particular type of fault in an AC supply to a load (LD) and providing a corresponding output (10), means (RLA) responsive to said output (10) to open a set of load contacts (SW1) to disconnect the load from the supply, test means (TS, Rt, W2) for simulating a supply fault of the said type, and means (C3, R5, SCR2, SOL, SW2) for causing the load contacts (SW1) to open if they do not open in response to the simulated fault within a certain period of time.

Preferably the detecting circuit comprises a circuit (CT, 100) for detecting a differential current in the AC supply to a load (LD), the differential current having a characteristic indicative of a type of supply fault to be detected, and providing a corresponding output (10), the disconnect means comprises an electromechanical switch (RLA) controlling the load contacts (SW1), the electromechanical switch being responsive to the said output (10) to disconnect the load from the supply by opening the load contacts (SW1), and the test means (TS, Rt, W2) simulates the supply fault by causing a differential current, having a characteristic indicative of the said type of fault, to flow in the detecting circuit in the absence of the supply fault.

In the present context an electromechanical switch is an electrical switch with mechanical contacts which are operated (i.e. opened and/or closed) by a magnetic field produced by current flowing in a coil, usually a solenoid.

Preferably the means for causing the load contacts (SW1) to open comprises a charge storage device (C3) which is connected to the supply for charging up during periods when the differential current is caused to flow in said detecting circuit by said simulating means, said certain period of time after which the load contacts (SW1) are caused to open being the time taken for the voltage on the charge storage device (c3) to reach a predetermined level sufficient to cause a solid state switch (SCR2) to change state, the load contacts (SW1) being caused to open in response to the change of state of the solid state switch (SCR2).

More preferably the electromechanical switch (RLA) may be of a type whose contacts (SW1) are held normally-closed by a current flowing through the switch at least when the supply is at or above a certain minimum voltage, and the change of state of the solid state switch (SCR2) causes the flow of current through the electromechanical switch (RLA) to be interrupted so as to open the load contacts (SW1).

In such a case the fault detecting device may include a further electromechanical switch (SOL) having normally-closed contacts (SW2) in series with the first electromechanical switch (RLA), and wherein the further electromechanical switch (SOL) is responsive to the change of state of the solid state switch (SCR2) to open the normally-closed contacts (SW2) of the further electromechanical switch (SOL).

Alternatively the fault detecting device may include a fuse (F1) in series with the first electromechanical switch (RLA), and wherein change of state of the solid state switch (SCR2) causes a current to flow through the fuse sufficient to blow the fuse.

As used herein, the term "fuse" means any component intended to go open circuit or high impedance in response to a surge current, and includes not only conventional melting type fuses but also, for example, PTC devices.

Preferably a further electromechanical switch (SOL2 or PMR) is coupled to the same load contacts (SW1) as the first electromechanical switch (SOL1), and the change of state of the solid state switch (SCR2) causes the further electromechanical switch (SOL2 or PMR) to open the load contacts (SW1).

In such a case the change of state of the solid state switch (SCR2) may cause a fuse (F1) to blow, the load contacts (SW1) being caused to open in response to the blown fuse.

In certain embodiments the fault to be detected is a residual current fault and the test means includes a test switch (TS) having normally-open contacts (SW3) and which when closed divert a portion of the supply current through the detecting circuit to cause a differential current to flow in said detecting circuit, closure of said test switch contacts (SW3) also connecting the charge storage device (C3) to the supply to allow the charge storage device to charge up.

In other embodiments the fault to be detected is an arc fault and the test means includes a test switch (TS) having normally-open contacts (SW3) and which when closed divert a portion of the supply current to power a test signal generating circuit (50) which causes said differential current to flow in said detecting circuit, closure of said test switch contacts (SW3) also connecting the charge storage device (C3) to the supply to allow the charge storage device to charge up.

BRIEF DESCRIPTION OF THE DRAWING FIGURES

Embodiments of the invention will now be described, by way of example, with reference to the accompanying drawings, in which.

DETAILED DESCRIPTION

In the various figures of the drawings the same references have been used for the same or equivalent components.

RCDs may be electrically latching (EL types) or mechanically latching (ML types), and the invention is applicable to both types.

Figure 1:
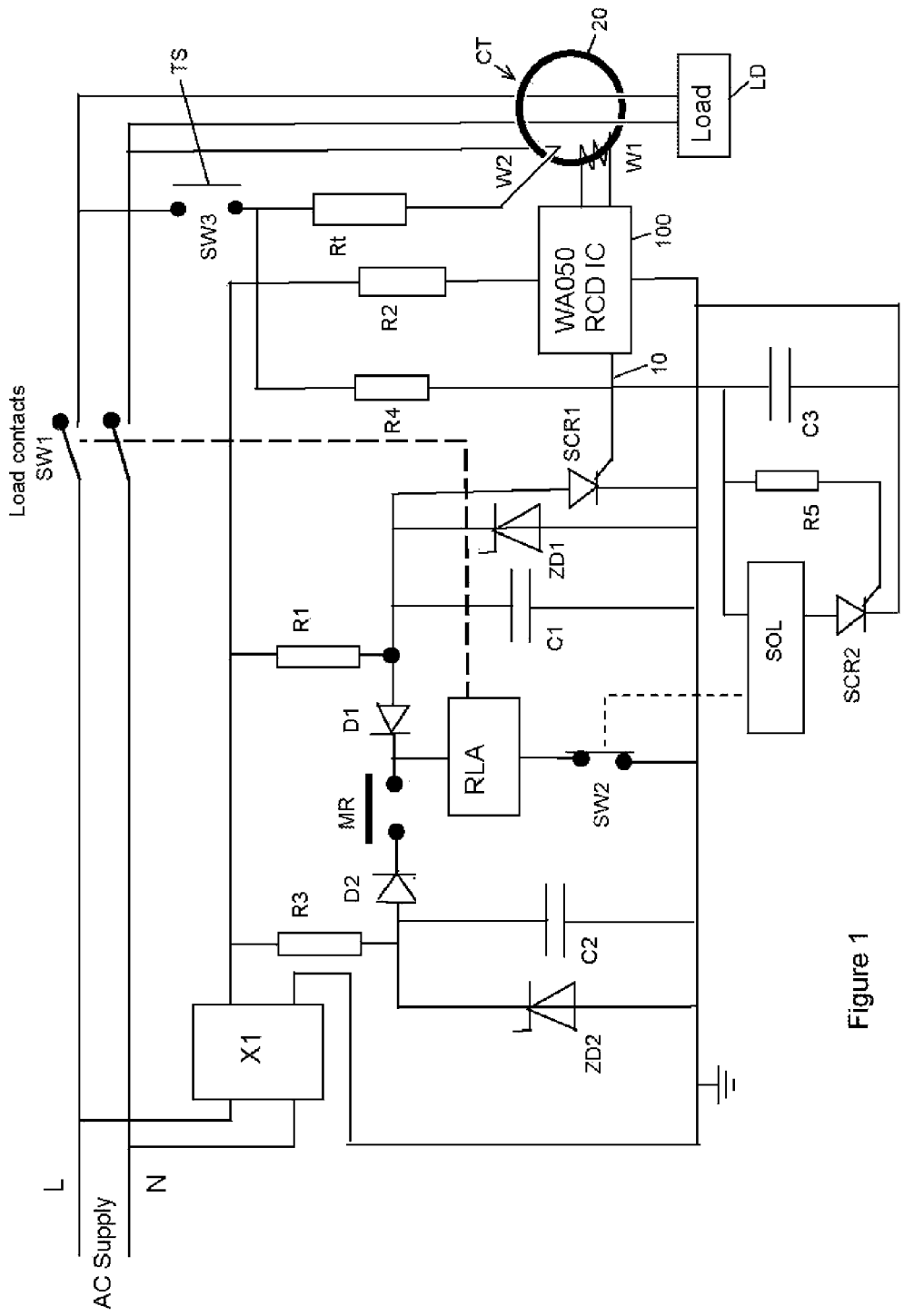
FIGS. 1 to 6 are circuit diagrams of first to sixth embodiments of the invention based on RCD circuits.

FIG. 1 shows an embodiment of the invention based upon the electrically latching (EL type) RCD circuit described in Patent Application PCT/EP2012/050911, which is incorporated herein by reference in its entirety.

In FIG. 1, an AC mains supply comprising live and neutral conductors L, N is connected to a load LD via normally-open load contacts SW1 controlled by an electromechanical relay RLA. The circuit is supplied with power via a bridge rectifier X1, and the relay is supplied with a DC current. The RCD circuit is built around an RCD integrated circuit (IC) 100, which may be a type WA050 supplied by Western Automation Research & Development and described in U.S. Pat. No. 7,068,047, which is incorporated herein by reference in its entirety. The IC 100 is supplied with current via a resistor R2.

The relay RLA is known as an electrically latching relay because it needs a constant current flow through its coil to maintain the contacts SW1 in the closed position. Thus, when a current of sufficient magnitude (known as the closing current) is passed through the coil the resultant magnetic flux causes the load contacts SW1 to close. Thereafter, the load contacts will remain closed provided a minimum holding current, less than the closing current, continues to flow through the relay coil. However, should the current flowing in the relay coil fall below the holding current the load contacts SW1 will automatically open and can then only be re-closed manually (if a manual reset, not shown, is provided) or by increasing the magnitude of the current through the relay at least to the closing current. This relay design is simple and well proven.

The live and neutral conductors L, N pass through the toroidal core 20 of a current transformer CT en route to the load. The output of the current transformer, which appears across a secondary winding W1, is fed to the IC 100. In the absence of a ground fault (residual) current, the vector sum of the currents flowing through the core 20 will be zero since the currents flowing in the L and N supply conductors will be equal and opposite; thus the voltage developed across W1 will be zero. The function of the CT and IC 100 is to detect a differential current (i.e. a non-zero vector sum of currents) flowing through the CT core 20 having sufficient magnitude and/or duration as to be indicative of a residual current, and when such a differential current is detected to provide a high output voltage on line 10 sufficient to turn on a silicon controlled rectifier SCR1.

In FIG. 1 a resistor R1 and a diode D1 provide current to the relay RLA via a bridge rectifier X1. A capacitor C1 smoothes the voltage across the relay RLA to prevent chatter. A Zener diode ZD1 limits the voltage to a specified maximum level. For supply voltages at or above a minimum operating voltage of the RCD, C1 will acquire a charge which will be at or above a voltage sufficient to provide a holding current through the relay RLA but insufficient to provide a closing current through the relay RLA.

Thus, a current of sufficient magnitude will flow continuously through RLA coil to enable the contacts SW1 to remain closed once they have closed. A capacitor C2 will acquire a charge via a resistor R3, and for supply voltages at or above the minimum operating voltage of the RCD, C2 will acquire a charge which will be at or above a voltage sufficient to provide a closing current through the relay RLA, although clamped by a Zener diode ZD2 at a safe level. The charge on C2 is supplied via the resistor R3, but this current flow is limited to a relatively low value so as to minimise power dissipation in R3. When a reset button MR is closed by manual means, the voltage on C2 will be applied to the RLA coil and the momentary application of this higher voltage will cause the relay RLA to close its contacts SW1. The voltage applied from C2 will quickly collapse but RLA will be held in the closed state by the holding current supplied via R1 and C1.

In the event of a residual current fault, as evidenced by an output on line 10 of the IC 100, the SCR1 will be turned on and effectively short out the coil of the relay RLA.

The resultant collapse in RLA voltage will cause the load contacts SW1 to open and remove power to the load LD. The SCR1 will turn off and C1 will charge up to its previous voltage again but RLA will not automatically reclose until the reset button MR is closed again.

The RCD also includes a test switch comprising a manually operable test button TS which, when pressed, bridges normally-open contacts SW3. Pressing the test button TS diverts a portion of the supply current through a winding W2 on the core 20, via a resistor Rt. The current diverted through the core 20 will produce a differential current (i.e. a non-zero vector sum of currents) flowing through the CT core 20, and the magnitude of the diverted current is selected such that the differential current so produced simulates a residual current. Accordingly, provided the RCD is operating correctly, the CT winding W1 will produce an output which will be detected by the IC 100 which will, in turn, produce an output 10 to turn on SCR1 and effectively short out the relay coil just as in the case of an actual residual current. Windings W1 and W2 may be separate windings or formed from a bifilar winding.

The embodiment of FIG. 1 further includes circuitry to disable the RCD in the event of the RCD failing to trip (i.e. the contacts SW1 failing to open) on operation of the test button TS. Such circuitry comprises the components resistors R4 and R5, capacitor C3, silicon controlled rectifier SCR2 and a solenoid SOL having normally-closed contacts SW2 in series with the relay RLA. Whereas the relay RLA is electrically latching and its contacts SW1 are only closed when a holding current is flowing through its coil, the solenoid SOL is mechanically latched and its contacts will open when a current is passed through its coil (SOL could alternatively be a permanent magnet relay (PMR) which is held closed by a permanent magnet and opens when a current is passed through the PMR, or any convenient switching means intended to cause permanent removal of the supply from the load).

When the test button TS is operated, the RCD will normally trip (i.e. the contacts SW1 will normally open) within about 40 mS. During this period a current will flow through the closed test switch and the resistor R4 to charge up the capacitor C3. If the RCD trips in response to operation of the test button within its specified time, the current flow to C3 will cease. However, if the RCD fails to trip on operation of the test button, the capacitor C3 will continue to charge and eventually, after a certain time longer than the normal response time of the RCD, the voltage on the capacitor C3 will rise to a level sufficient to turn on SCR2 via resistor R5. At this point capacitor C3 will discharge through the solenoid SOL. Activation of SOL will cause its normally closed contacts SW2 to open and remove the supply to RLA, causing its contacts SW1 to open in turn and remove power from the protected load LD. Preferably the RCD will be disabled with this arrangement to the extent that the RCD would need to be repaired or corrected before it could be successfully tested and operate normally again. More usually, however, the RCD would simply be replaced. A bleed resistor (not shown) may be placed across C3 to ensure its discharge after each operation of the test circuit.

Instead of a silicon controlled rectifier, the solid state switch SCR1 and/or SCR2 may be a bipolar transistor, MOSFET or other solid state device which changes between high and low impedance states under the control of a signal applied at a control terminal.

Figure 2:
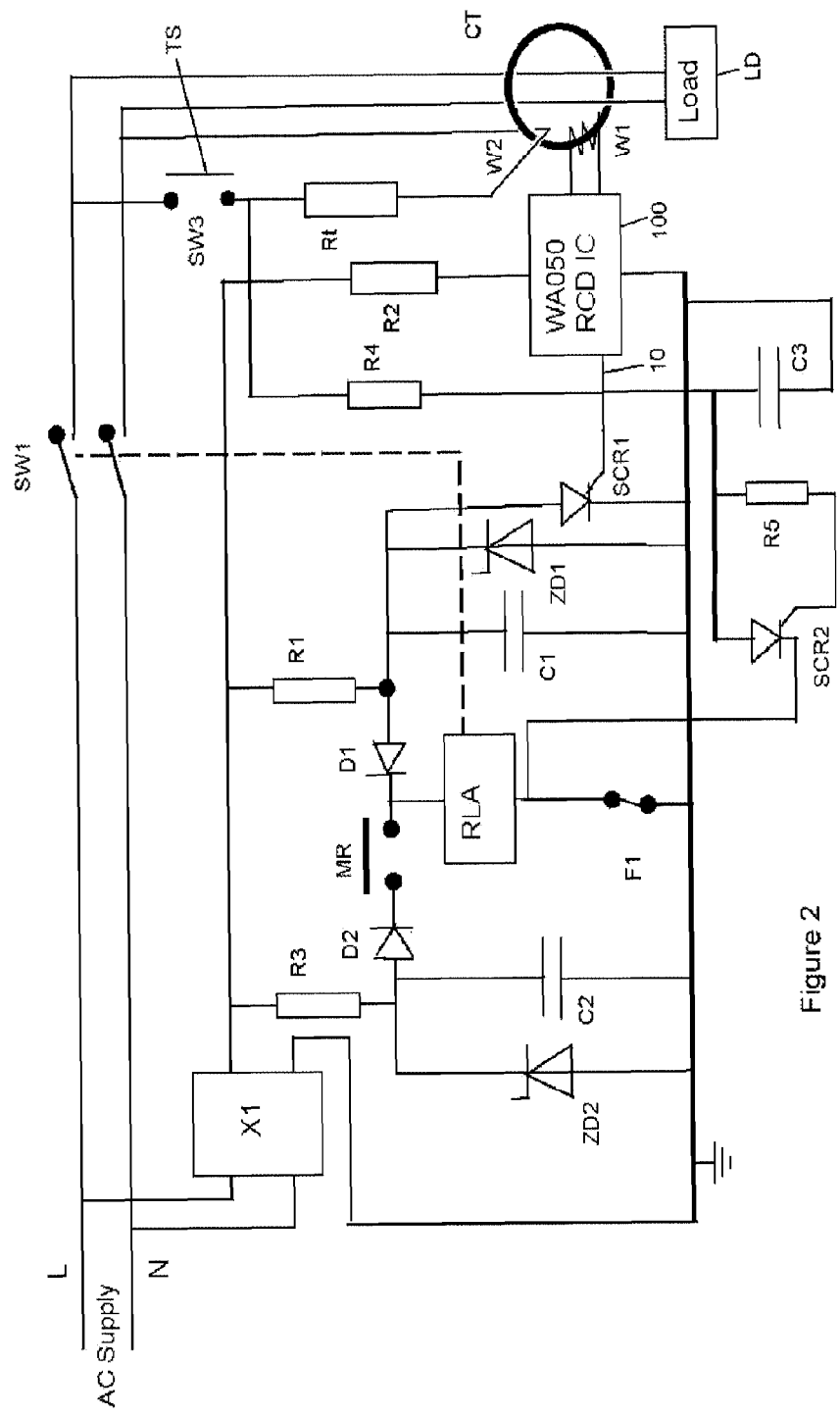

FIG. 2 shows a second embodiment of the invention which is similar to that of FIG. 1 except that SOL and its contacts SW2 have been replaced by a fuse F1 in series with the relay RLA and which is suitably rated for normal operation of the RCD circuit. If the RCD fails to trip on operation of the test button TS, capacitor C3 will charge up as before and cause SCR2 to turn on after a certain period of time, and the resultant current flow via SCR2 and fuse F1 will cause the fuse to blow due to the excessive current flow through it. The relay RLA will therefore de-energise and its contacts SW1 will open as before, and the RCD will be disabled.

The arrangement of FIG. 2 ensures end of life operation of the RCD in the event of failure of any of the key components including but not necessarily limited to X1, CT, Rt, WA050, TR1, R2, etc.

Figure 3:
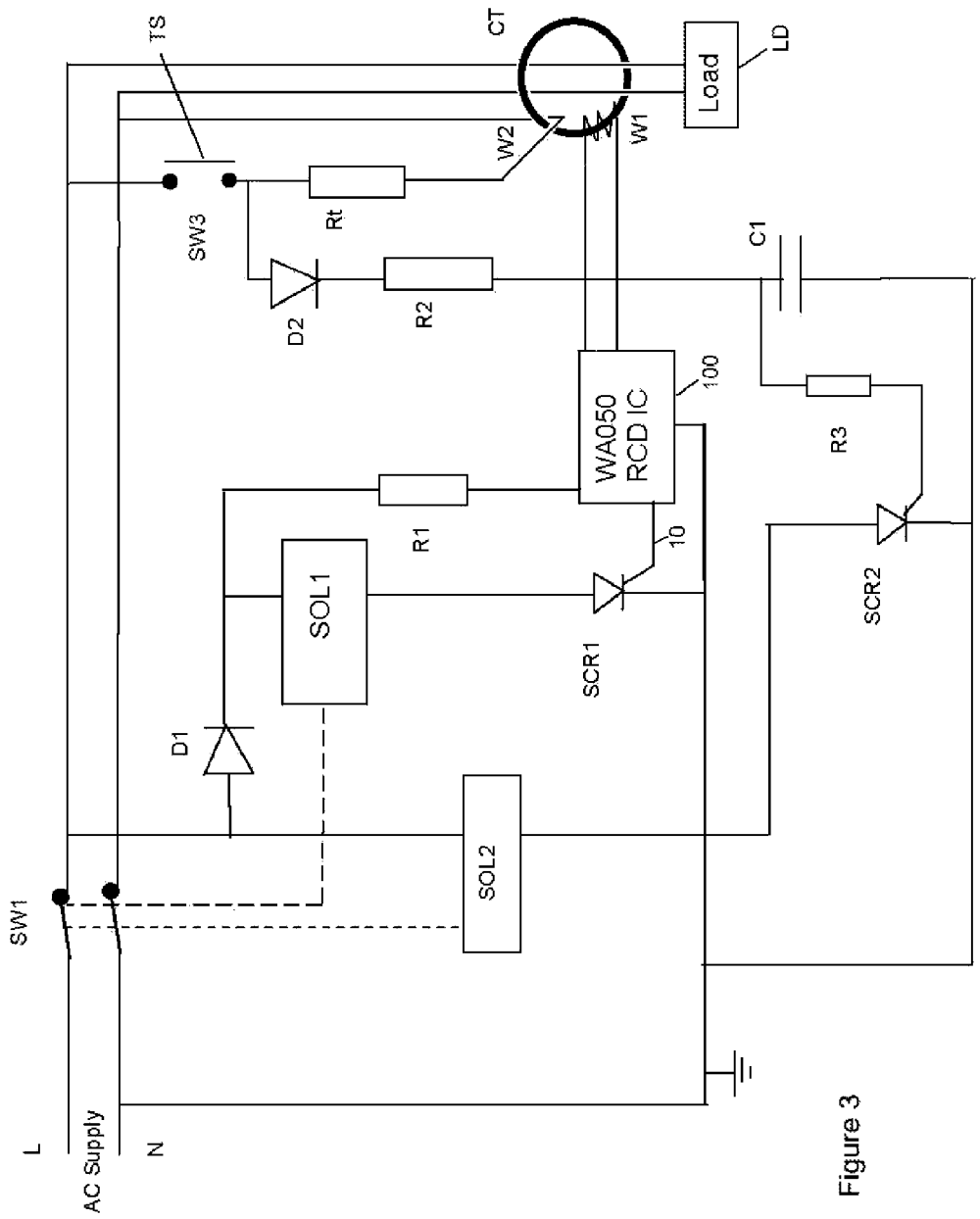

FIG. 3 is a circuit diagram showing a simplified version of a mechanically latched (ML type) RCD circuit embodying the invention. In this case the load contacts SW1 are normally mechanically latched closed but can be opened by a sufficient current flowing through an associated solenoid SOL1. As in the previous embodiments, if there is a differential current flowing through the CT core having a magnitude and/or duration characteristic of a residual current, whether produced by an actual residual current or by the test circuit on pressing the test button TS, the IC 100 will produce an output 10 which will turn on the SCR1. This will allow supply current to flow through a solenoid SOL1 which will open its mechanically latched contacts SW1 and remove power to the load LD.

SOL1 typically comprises a plunger which is biased towards a first position by a spring and which is moved to a second position during energisation of the solenoid so as to cause the load contacts to open, the plunger reverting to the first position on de-energisation of the solenoid and thereby facilitating manual reclosing of the contacts SW1.

The embodiment of FIG. 3 further includes circuitry to disable the RCD if the RCD contacts SW1 fail to open when the test button TS is operated. Such circuitry comprises diode D2, resistors R2 and R3, capacitor C1, silicon controlled rectifier SCR2 and solenoid SOL2. The solenoid SOL2 is coupled to the same mechanically latched load contacts SW1 as the solenoid SOL1.

When the test button TS is operated, the RCD contacts SW1 will normally open within about 40 mS. During this period a current will flow through the closed test switch and D2 and R2 to charge up the capacitor C1. If the RCD trips in response to operation of the test button within its specified time, the current flow to C1 will cease. However, if the RCD fails to trip on operation of the test button, the capacitor C1 will continue to charge and eventually, after a certain time longer than the normal response time of the RCD, the voltage on the capacitor C1 will rise to a level sufficient to turn on SCR2 via resistor R3. This will allow supply current to flow through the solenoid SOL2 which will open the mechanically latched contacts SW1 and remove power to the load LD.

In this case the plunger in SOL2 may be a latching type which when moved from its first position to a second position remains in the second position so as to prevent manual reclosing of the contacts, and in this way prevent restoration of supply to the protected circuit. A bleed resistor (not shown) may be placed across C1 to ensure its discharge after each operation of the test circuit.

Figure 4:
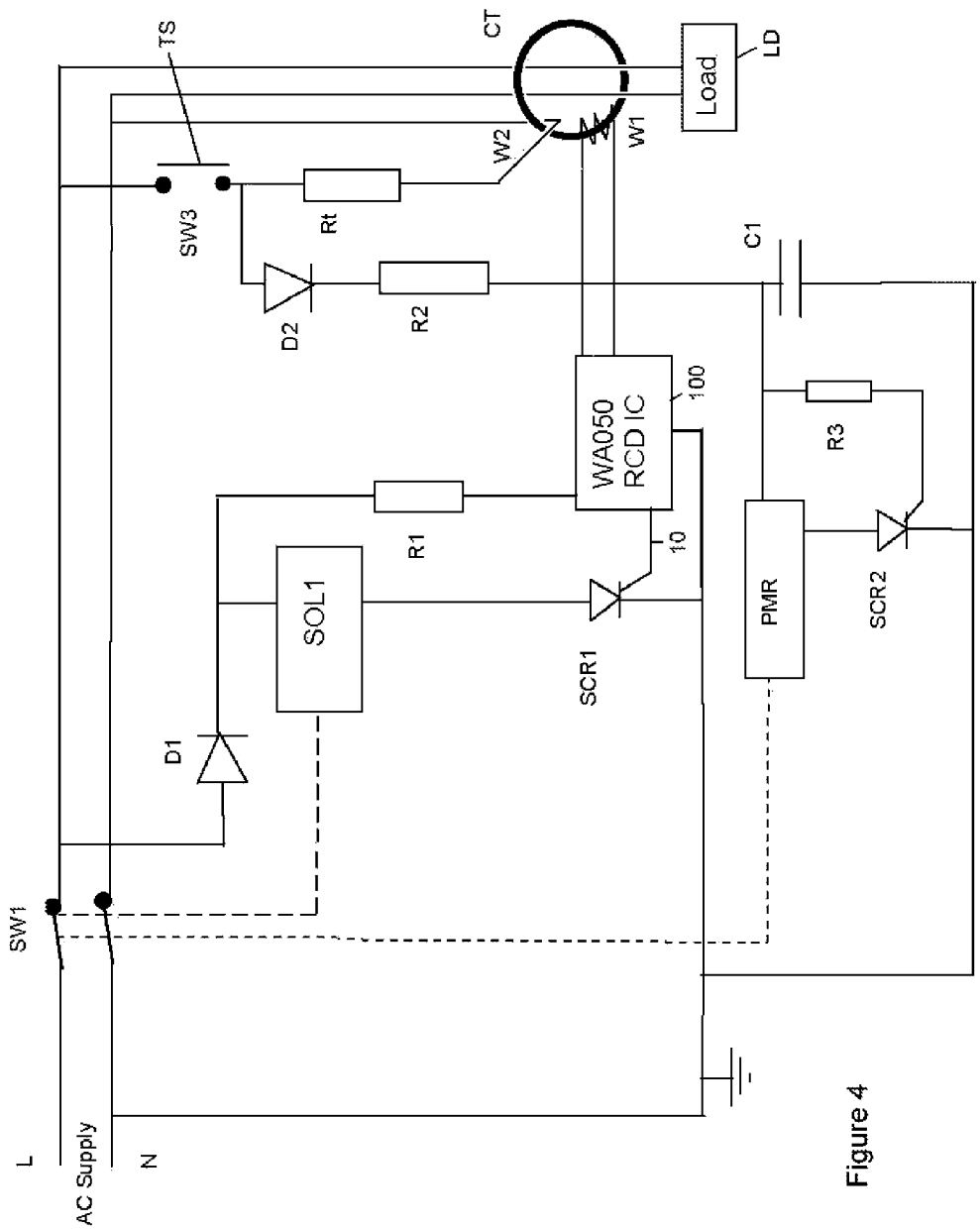

A permanent magnet relay (PMR) would also be suitable for this application, as shown in FIG. 4. In the arrangement of FIG. 4, a permanent magnet relay (PMR) is used instead of the solenoid SOL2. When the voltage on C1 reaches a certain level SCR2 will turn on and cause C1 to discharge through the PMR which is turn will cause the contacts SW1 to open. The user will not have access to the PMR and it will not be possible to reset it and to reclose the contacts. The PMR has the advantage over the solenoid arrangement of being isolated from the mains supply which reduces the risk of SCR2 being inadvertently turned on, for example by voltage spikes on the mains supply.

Provision could be made to facilitate resetting of SOL2 or the PMR by removing the RCD from its installation and manually resetting the SOL or PMR opening means, for example by providing access from the back or the side of the RCD. However, this facility would preferably not be available to the user once the RCD has been installed and would only be intended for use by an experienced installer. If the SOL or PMR was reset, the RCD could be reinstalled, reclosed as normal and tested again by operation of the test button. Failure to trip as intended would again result in disabling of the RCD.

Figure 5:
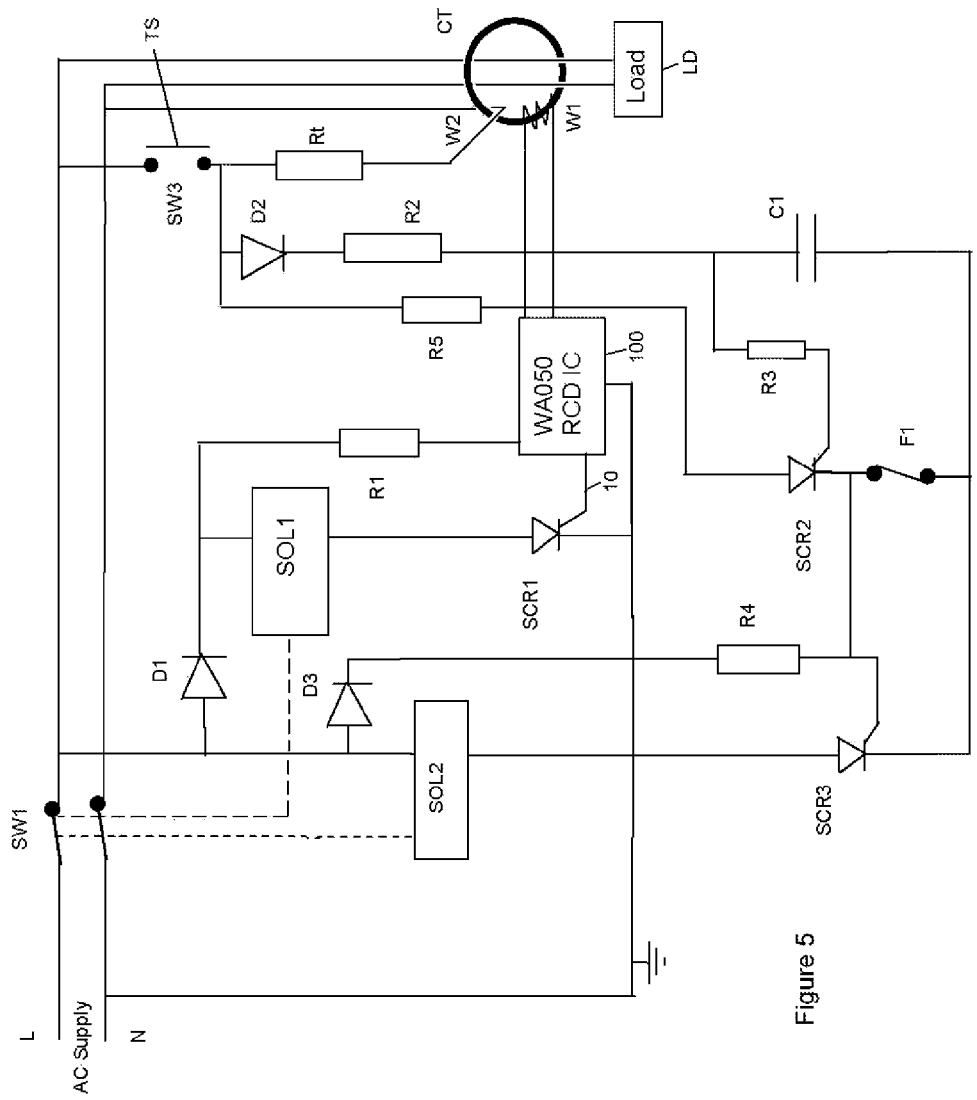

FIG. 5 shows another embodiment of an ML RCD, which uses a fuse to disable the RCD.

In the arrangement of FIG. 5 there is an end of life circuit comprising the components solenoid SOL2, diode D3, resistor R4, silicon controlled rectifier SCR3 and fuse F1. SCR3 is held in a non-conducting state because its gate is tied firmly to ground by fuse F1. If the RCD fails to open on operation of the test button, C1 will charge up and cause SCR2 to turn on, as previously described. The resultant current flow through R5, SCR2 and F1 will cause fuse F1 to blow (the term "blow" includes the case of, for example, a PTC device going high impedance). SCR3 will be turned on by R4 pulling its gate high, at which stage supply current will flow through SOL2, causing the RCD contacts SW1 (which are connected in common to SOL1 and SOL2, as before) to open. Each time the RCD is subsequently reset it will autotrip if a conventional fuse is used for F1. If a PTC device is used, it will revert to its original low impedance when it has cooled down, but on subsequent operation of the test button it will force the RCD to trip as previously described.

The arrangement of FIG. 5 ensures end of life operation of the RCD in the event of failure of any of the key components including but not necessarily limited to, D1, CT, Rt, SOL1, R1, IC, SCR1, etc.

An LED with a current limiting resistor may advantageously be placed in parallel with F1 or SOL2. This LED will light up momentarily when SCR3 turns on, thus providing indication of an end of life operation.

The solenoids SOL1 and SOL2 in FIG. 5 could be combined such that the combination comprises of a single solenoid device with two windings, SOL1 and SOL2. Winding SOL2 would only be operated by SCR3 in the event of failure of the RCD to open on operation of the test button. Likewise with FIG. 4, a single PMR could be used instead of a solenoid and a PMR.

Figure 6:
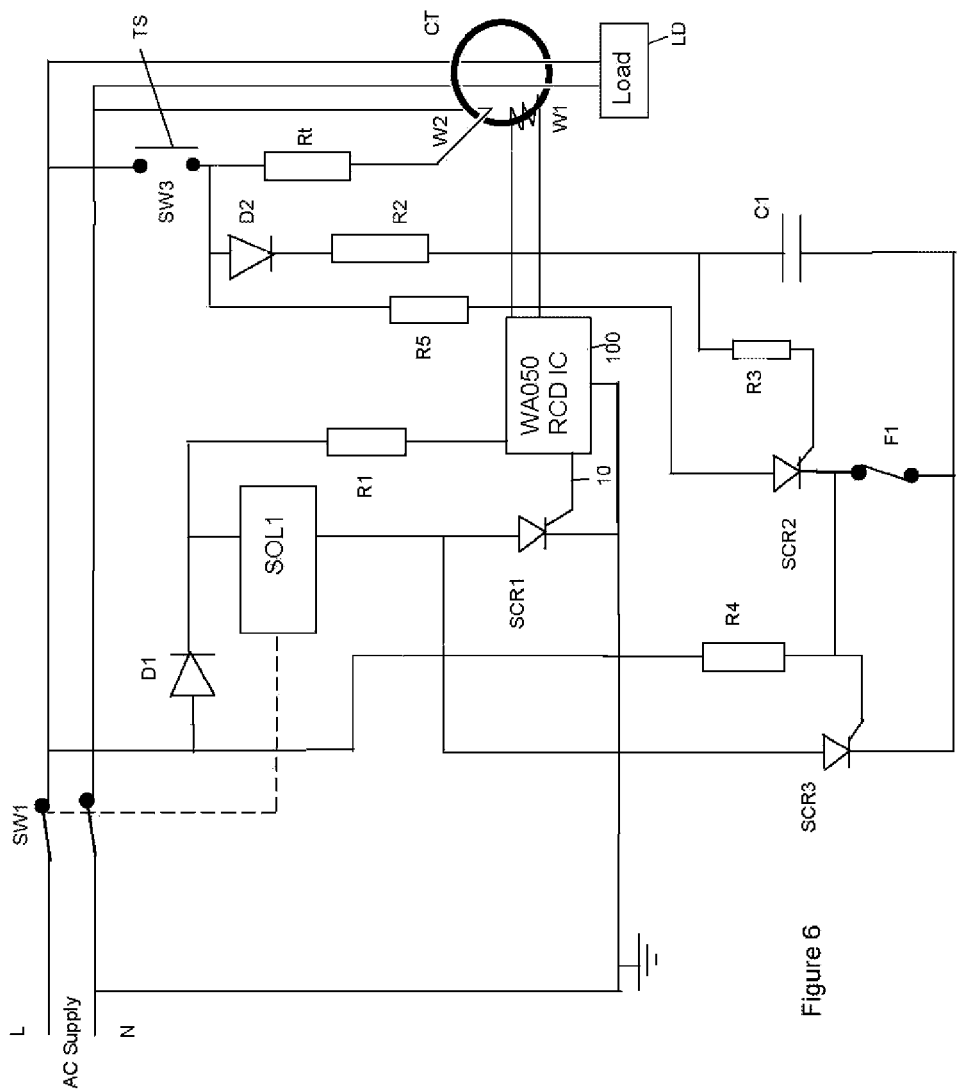

FIG. 6 shows an alternative version of FIG. 5. In the arrangement of FIG. 6, a single solenoid SOL1 is used. This can be energised under normal conditions by SCR1, or under end of life conditions by SCR3, as previously described.

Figure 7:
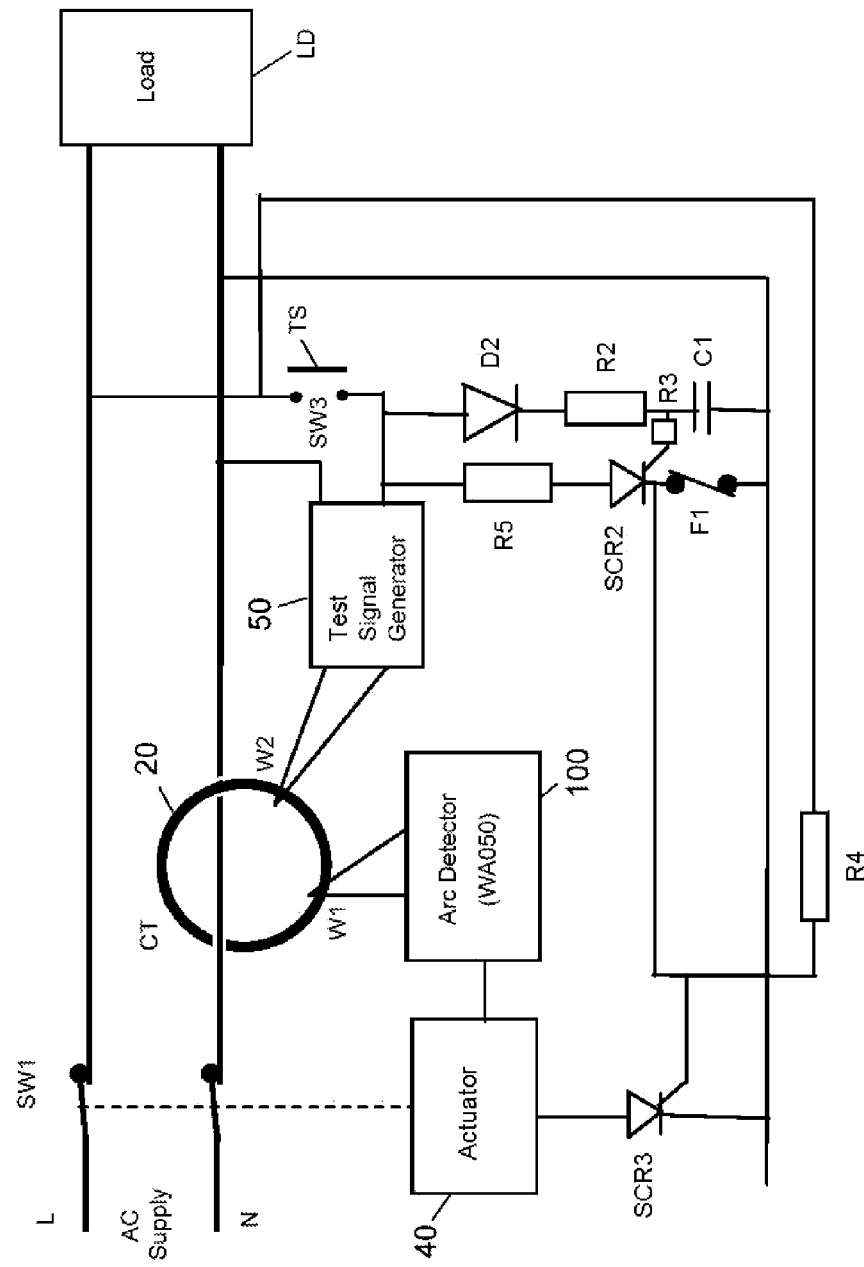
FIG. 7 is a circuit diagram of a seventh embodiment of the invention based on an AFD circuit.

FIG. 7 shows an embodiment of the invention based upon the arc fault detector (AFD) circuit described with respect to FIG. 8 of Patent Application PCT/EP2011/058754, which is incorporated herein by reference in its entirety.

A single phase AC mains supply to a load LD comprises live L and neutral N conductors. In the absence of an arc fault condition, the full load current will flow in the conductors. A series or parallel arc fault condition will result in an arcing current flow in the circuit with a broad spectrum of frequencies.

In this embodiment, for the detection of arc faults a current transformer CT has a core 20 which surrounds just one of the supply conductors, in this case the neutral conductor N. The design of the CT is such that it has minimal response to slowly rising or sustained load currents at the mains supply frequency but is highly responsive to current pulses with very fast rise times which would be generated by arcing.

Arc fault current pulses in the neutral conductor N induce voltage spikes across the secondary winding W1. When these are above a certain threshold the IC 100, here configured as an arc detector, will produce an output to an actuator 40. In response, the actuator 40 opens associated load contacts SW1 to disconnect the mains supply from the load LD. The details of the actuator 40 are not shown, but the actuator 40 may include a relay, solenoid or PMR, together with associated circuitry, as described for previous embodiments. In the present case it will be assumed that the actuator 40 includes a solenoid SOL1 arranged as shown and described with reference to FIG. 6.

When a test button TS is operated a test signal generator 50 is powered up from the mains supply and produces a series of pulses which will flow through a further winding W2 on the CT core 20. These pulses are designed to produce a differential current in the CT having characteristics which simulate the differential current produced by an actual arc fault (actually, due to the neutral conductor N passing though the core 20, there will always be a non-zero vector sum of currents flowing through the CT, but the characteristics of the detection circuitry are designed not to respond to it). These pulses will be detected by the winding W1 and fed to the IC 100 and cause the actuator 40 to open the load contacts SW1 as before, typically within about 50 mS. The contacts can be reclosed by manual operation.

FIG. 7 also includes an "end of life" circuit comprising diode D2, resistors R2, R3, R4 and R5, capacitor C3, silicon controlled rectifiers SCR2 and SCR3, and fuse F1. These operate in the same way as the like referenced components in the end of life circuit of FIG. 5.

When the test button TS is pressed to bridge the contacts SW3, capacitor C1 will start to charge up via R2 and D2. However, the AFD would normally trip (i.e. load contacts SW1 open) within a certain time, e.g. 50 mS, in which case power would be removed from the circuit and all activity would cease. However in the event of the AFD failing to trip within the allotted time, C1 would continue to charge up, and after a certain period, e.g. 200 mS, the voltage on C1 would rise to a value sufficient to turn on SCR2 via R3. Once SCR2 turns on a relatively large current will flow via R5 through SCR2 and fuse F1. This current will be well in excess of the rating of the fuse F1 so as to cause it to blow. When F1 blows SCR3 gate will be pulled high by R4 which will cause SCR3 to turn on and activate the solenoid SOL1 in the actuator 40. On each subsequent occasion when the AFD load contacts SW1 are manually closed, the device will automatically trip because of SCR3 being turned on and it will no longer be possible to use the AFD, thus indicating that it has reached the end of life state.

The invention is not limited to the embodiments described herein which may be modified or varied without departing from the scope of the invention.

The invention claimed is:

1. A device for detecting a fault in an AC (Alternating Current) supply, comprising:
   a detecting circuit comprising circuitry for detecting a differential current in the AC supply to a load, the differential current having a characteristic indicative of a type of supply fault to be detected, and providing a corresponding output,
   disconnect means comprising a first electromechanical switch controlling a set of load contacts, the first electromechanical switch being responsive to the corresponding output to open the set of load contacts to disconnect the load from the supply within a normal response time of the device, said normal response time being from about 40 ms to about 50 ms,
   test means for simulating a supply fault of the said type by causing the differential current, having the characteristic indicative of the said type of fault, to flow in the detecting circuit in the absence of the supply fault, and
   opening means for causing the load contacts to open within a certain period of time longer than the normal response time of the device, if they do not open in response to the simulated fault, the opening means comprising a charge storage device which is connected to the supply for charging up during periods when the differential current is caused to flow in the detecting circuit by the test means, the said certain period of time after which the load contacts are caused to open being the time taken for the voltage on the charge storage device to reach a predetermined level sufficient to cause a solid state switch to change state, the load contacts being caused to open in response to the change of state of the solid state switch.

2. A fault detecting device as claimed in claim 1, in which the first electromechanical switch is a relay whose contacts are held normally-closed by a current flowing through the switch at least when the supply is at or above a certain minimum voltage, and the change of state of the solid state switch causes the flow of current through the electromechanical switch to be interrupted so as to open the load contacts.

3. A fault detecting device as claimed in claim 2, including a further electromechanical switch having normally-closed contacts in series with the first electromechanical switch, and wherein the further electromechanical switch is responsive to the change of state of the solid state switch to open the normally-closed contacts of the further electromechanical switch.

4. A fault detecting device as claimed in claim 2, including a fuse in series with the first electromechanical switch, and wherein change of state of the solid state switch causes a current to flow through the fuse sufficient to blow the fuse.

5. A fault detecting device as claimed in claim 1, in which the first electromechanical switch is a solenoid whose contacts are opened by a current flowing through a coil of the solenoid, the device including a further electromechanical switch coupled to the same load contacts as the first electromechanical switch, and the change of state of the solid state switch causes the further electromechanical switch to open the load contacts.

6. A fault detecting device as claimed in claim 5, wherein the change of state of the solid state switch causes a fuse to blow, the load contacts being caused to open in response to the blown fuse.

7. A fault detecting device as claimed in claim 1, wherein the particular type of fault to be detected is a residual current fault and the test means includes a test switch having normally-open contacts and which when closed divert a portion of the supply current through the detecting circuit to cause the differential current to flow in the detecting circuit, closure of the test switch contacts also connecting the charge storage device to the supply to allow the charge storage device to charge up.

8. A fault detecting device as claimed in claim 1, wherein the particular type of fault to be detected is an arc fault and the test means includes a test switch having normally-open contacts and which when closed divert a portion of the supply current to power a test signal generating circuit which causes the differential current to flow in the detecting circuit, closure of the test switch contacts also connecting the charge storage device to the supply to allow the charge storage device to charge up.

* * * * *